US008324900B2

(12) United States Patent
Helvoort et al.

(10) Patent No.: US 8,324,900 B2
(45) Date of Patent: Dec. 4, 2012

(54) MAGNETIC RESONANCE INTEGRATED-CIRCUIT LOW-NOISE AMPLIFIER

(75) Inventors: Marinus Johannes Adrianus Maria Helvoort, Eindhoven (NL); Paulus Cornelius Hendrikus Adrianus Haans, Eindhoven (NL); Leo De Vreede, Eindhoven (NL)

(73) Assignee: Koninklijke Philips Electronic N.V., Eindhoven (NL)

( * ) Notice: Subject to any disclaimer, the term of this patent is extended or adjusted under 35 U.S.C. 154(b) by 259 days.

(21) Appl. No.: 12/601,532

(22) PCT Filed: May 30, 2008

(86) PCT No.: PCT/IB2008/052113
§ 371 (c)(1),
(2), (4) Date: Nov. 24, 2009

(87) PCT Pub. No.: WO2008/146256
PCT Pub. Date: Dec. 4, 2008

(65) Prior Publication Data
US 2010/0164498 A1    Jul. 1, 2010

(30) Foreign Application Priority Data

May 31, 2007 (EP) .................................. 07109257

(51) Int. Cl.
*G01V 3/00* (2006.01)
(52) U.S. Cl. ........ 324/322; 324/318; 324/313; 324/310; 324/307; 324/314
(58) Field of Classification Search .......... 324/300–322; 330/310, 295, 85, 110; 600/407–435; 382/128–131
See application file for complete search history.

(56) References Cited

U.S. PATENT DOCUMENTS 2,996,658 A * 8/1961 Jimerson, Jr. et al. ........ 324/310
2,999,976 A * 9/1961 Francis et al. ................ 324/307
3,099,793 A * 7/1963 Pinkley ......................... 324/313

(Continued)

FOREIGN PATENT DOCUMENTS

DE    4037294 A1    7/1991

(Continued)

OTHER PUBLICATIONS

Cherifi, T., et al.; A CMOS Microcoil-associated Preamplifier for NMR Spectroscopy; 2005; IEEE Trans. on Circuits and systems; 52(12)2576-2583.

(Continued)

*Primary Examiner* — Melissa Koval
*Assistant Examiner* — Tiffany Fetzner

(57) ABSTRACT

It is proposed herein to improve the specifications of a low-noise amplifier (LNA) by integrating it in a chip. In order to cover a range of operating frequencies using a single chip, the integrated-circuit amplifier proposed herein comprises an input port configured to receive a magnetic resonance (MR) signal from a radio-frequency (RF) coil, one or more LNAs configured to amplify the received MR signal, and an output port configured to output the amplified MR signal from the one or more LNAs. The operating frequency of the RF coil depends on the field strength. The matching circuit, if present, needs to be tuned to operate at the operating frequency of the RF coil, and depends on the component values in the loop, thus on loop size. In contrast, the proposed integrated-circuit amplifier is capable of directly connecting to RF coils with different loop sizes, without the need for a matching circuit.

18 Claims, 4 Drawing Sheets

U.S. PATENT DOCUMENTS

| | | | | |
|---|---|---|---|---|
| 3,122,702 A * | 2/1964 | Franken | | 324/304 |
| 3,174,099 A * | 3/1965 | Larson | | 324/310 |
| 3,418,564 A * | 12/1968 | Nelson | | 324/310 |
| 3,588,678 A * | 6/1971 | Ernst | | 324/310 |
| 3,860,818 A * | 1/1975 | Stalder et al. | | 250/343 |
| 4,629,987 A * | 12/1986 | King et al. | | 324/306 |
| 4,631,495 A * | 12/1986 | Mueller et al. | | 330/310 |
| 4,731,585 A * | 3/1988 | Fox | | 324/322 |
| 5,296,813 A | 3/1994 | Holmes et al. | | |
| 6,838,936 B2 * | 1/2005 | Oppelt | | 330/110 |
| 7,378,851 B1 * | 5/2008 | de Rooij et al. | | 324/322 |
| 7,646,249 B2 * | 1/2010 | Hajimiri et al. | | 330/297 |
| 7,652,476 B2 * | 1/2010 | de Rooij et al. | | 324/322 |
| 7,710,197 B2 * | 5/2010 | Aoki et al. | | 330/252 |
| 7,999,621 B2 * | 8/2011 | Hajimiri et al. | | 330/297 |
| 2003/0234684 A1 * | 12/2003 | Oppelt | | 330/85 |
| 2005/0001680 A1 | 1/2005 | Ratzel | | |
| 2006/0033499 A1 * | 2/2006 | Flexman et al. | | 324/322 |
| 2006/0202699 A1 * | 9/2006 | Reiderman | | 324/339 |
| 2008/0136414 A1 * | 6/2008 | de Rooij et al. | | 324/322 |
| 2008/0136415 A1 * | 6/2008 | de Rooij et al. | | 324/322 |
| 2008/0211584 A1 * | 9/2008 | Hajimiri et al. | | 330/297 |
| 2009/0015328 A1 * | 1/2009 | Aoki et al. | | 330/252 |
| 2010/0164498 A1 * | 7/2010 | Helvoort et al. | | 324/322 |
| 2011/0091987 A1 * | 4/2011 | Weissleder et al. | | 436/173 |

FOREIGN PATENT DOCUMENTS

| | | |
|---|---|---|
| EP | 0344293 B1 | 3/1995 |
| EP | 1521094 A1 | 4/2005 |
| JP | 08191813 A | 7/1996 |
| JP | 09024036 A | 1/1997 |
| RU | 2417745 C1 * | 5/2011 |
| WO | 2006048816 A1 | 5/2006 |
| WO | 2007043009 A2 | 4/2007 |
| WO | WO 2008146256 A2 * | 12/2008 |

OTHER PUBLICATIONS

Girlando, G., et al.; Noise Figure and Impedance Matching in RF Cascode Amplifiers; 1999; IEEE Trans. on circuits and Systems; 46(11)1388-1396.

Texas Instruments; Information for Medical Applications; downloaded Jul. 11, 2006 http://focus.ti.com/lit/ml/slyb108a/slyb108a. pdf see p. 3 and 4.

* cited by examiner

US 8,324,900 B2

MAGNETIC RESONANCE INTEGRATED-CIRCUIT LOW-NOISE AMPLIFIER

FIELD OF THE INVENTION

The invention relates to the field of low-noise amplifiers (LNA) for radio-frequency (RF) applications, and particularly to LNA devices for RF coils in a magnetic resonance (MR) system.

BACKGROUND OF THE INVENTION

The European patent application EP0344293B1 discusses a nuclear magnetic resonance signal acquisition apparatus that includes a coil, a matching means and a preamplifier. The coil has a source impedance (designated $R_s$ in the aforementioned European patent application), while the preamplifier has an optimum source impedance $R_{opt}$ and an input impedance $R_{in}$, with $R_{in}$ being less than $R_{opt}$. The matching means connects the coil to the preamplifier such that the source impedance of the coil $R_s$ is transformed by the matching means to be approximately equal to the optimum source impedance $R_{opt}$ at the point of connection between the matching means and the preamplifier. At the same time, the low input impedance of the preamplifier is transformed by the matching means to be a value higher than the optimum source impedance $R_{opt}$ at the point of connection between the matching means and the coil.

SUMMARY OF THE INVENTION

A matching means as described above could have fairly large dimensions which could add to the size of the integrated-circuit amplifier device. It could also add unwanted noise to the signal received by the coil itself. In addition, in the case of coils with multiple transmitting or receiving loops, e.g., phased-array coils, the matching means of one loop might couple with the $B_1$ transmit fields of other loops, and could also result in an increased number of parasitic loops.

It is therefore proposed herein to improve the specifications of the LNA by integrating it in a chip. In order to cover a range of operating frequencies using a single chip, the integrated-circuit amplifier proposed herein comprises an input port configured to receive an MR signal from an RF coil, one or more LNAs configured to amplify the received MR signal, and an output port configured to output the amplified MR signal from the one or more LNAs. The operating frequency of the RF coil is dependent on the field strength of the main magnetic field. The matching circuit, as mentioned in the prior art, needs to be tuned to operate at the operating frequency of the RF coil. The component values in the matching circuit depend on the loop size. In contrast, the proposed integrated-circuit amplifier is capable of directly connecting to RF coils with different loop sizes, without the need for a matching circuit.

BRIEF DESCRIPTION OF THE DRAWINGS

These and other aspects will be described in detail hereinafter, by way of example, on the basis of the following embodiments, with reference to the accompanying drawings, wherein.

Corresponding reference numerals when used in the various figures represent corresponding elements in the figures.

DETAILED DESCRIPTION OF EMBODIMENTS

Phased-array coils, sometimes also referred to as "Synergy" coils, employ multiple receive loops simultaneously to receive MR signals from a subject under examination. Due to the proximity of the coil loops to one another, noise currents in one loop could couple to other loops. If each of the loops were connected to a high impedance, the flow of potentially problematic noise currents could be blocked.

Since the MR signals received by the loops are very weak, the signals need to be amplified in order to obtain reasonable image quality. LNAs are often used for amplifying the MR signals. However, currently known LNA topologies generate low noise only within a specific, small range of input impedances (optimal impedance $Z_{opt}$); in other words, outside of this range of input impedances, the noise levels generated by the LNA are high.

In general, there will be a mismatch between the requirements on the impedance seen by the loop and the optimal impedance at the input of the LNA. This problem is generally solved in phased-array or synergy coils by adding a transformer network (also known as a matching network) between the receive loop and the LNA. The disadvantage of adding a matching network is that it might add additional noise and could also take up significant space, which prevents miniaturization of the complete preamplifier assembly. In addition, the matching circuits themselves might mutually couple to each other, due to the high quality, core-less inductors needed in their construction.

Figure 1:
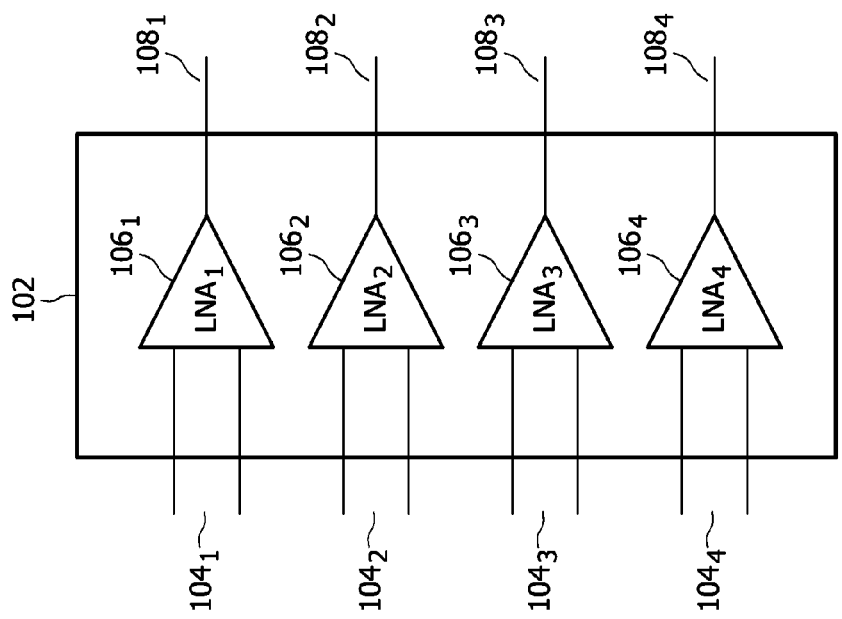
FIG. 1 shows an embodiment of the integrated-circuit amplifier disclosed herein, wherein multiple LNAs are provided on a single chip with individual inputs and outputs for each LNA.

FIG. 1 shows an embodiment in which the integrated-circuit amplifier 102 is formed on a single chip having several LNAs on-board. Four LNAs $106_1$, $106_2$, $106_3$ and $106_4$ are shown integrated on a single integrated-circuit amplifier chip 102. Each LNA $106_1$, $106_2$, $106_3$ and $106_4$ has its own input port $104_1$, $104_2$, $104_3$ and $104_4$, and its own output port $108_1$, $108_2$, $108_3$ and $108_4$, respectively.

As each LNA has its own separate input and output, it is possible to select the appropriate LNA by connecting a receive coil to the appropriate input port $104_1$, $104_2$, $104_3$ or $104_4$ of the integrated-circuit amplifier 102. In the exemplary embodiment shown in FIG. 1, the four different LNAs $106_1$, $106_2$, $106_3$ and $106_4$, have four different optimal input impedances, for example 20 Ohm, 54 Ohm, 9 Ohm and 22 Ohm, respectively. The operational frequency of the first two LNAs $106_1$, $106_2$ is 128 MHz, while that of the last two LNAs $106_3$, $106_4$ is 64 MHz. It is possible to have more LNAs on the same chip, operating at the above or other operational frequencies. It is also possible to have LNAs with other optimal input impedances as well.

The above design of the integrated-circuit amplifier permits an end-user, for example an imaging technician at a healthcare facility, to connect RF coils having various loop sizes (and therefore, operating at different resonance frequencies) to the same integrated-circuit amplifier by simply connecting the coil to the appropriate input $104_1$, $104_2$, $104_3$ or $104_4$, thereby selecting the appropriate LNA within the integrated-circuit amplifier chip 102. Though this would be a useful item for clinical research sites, in the normal product these items are preassembled into a coil. The real customer value is improved image quality (as there is no noise added by the matching circuit), more compact coil design and less weight on the patient. For example, a cascode amplifier with a shunt inductor, manufactured using PHILIPS' CMOS 250 nm technology, makes it feasible to directly couple the RF receive loop to the LNA, without a matching network.

Figure 2:
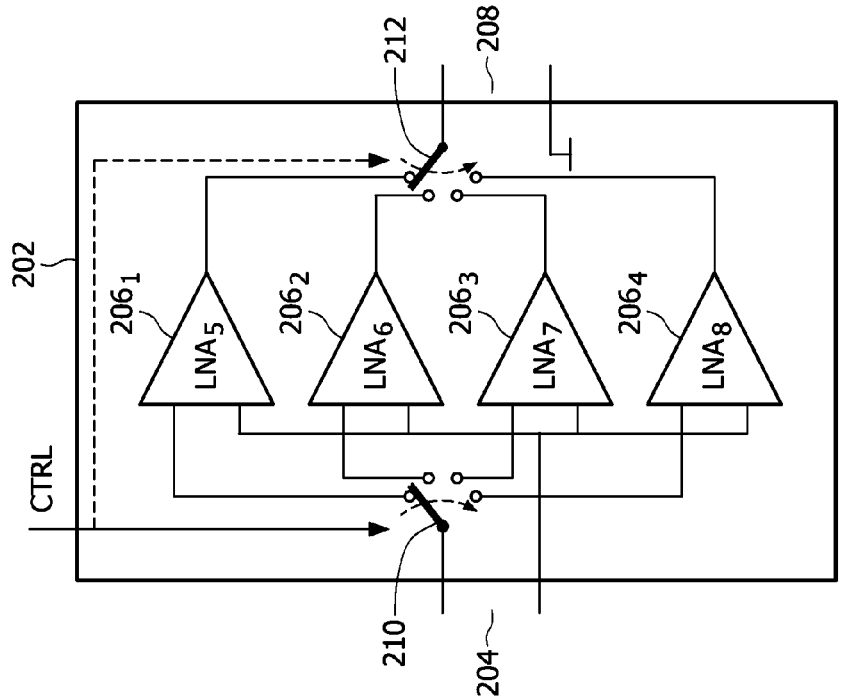
FIG. 2 shows a second embodiment of the integrated-circuit amplifier with multiple LNAs that are selectable based on a control signal.

FIG. 2 shows an embodiment of the integrated-circuit amplifier disclosed herein, wherein the integrated-circuit amplifier 202 is configured as a single chip have multiple LNAs $206_1$, $206_2$, $206_3$ and $206_4$ on-board and with a single input 204 and single output 208. The input stage of a particular LNA $206_1$, $206_2$, $206_3$ or $206_4$ is chosen by a low-loss multiplex or switching device 210, for example a microelectromechanical switch (MEMS). A similar switching device 212 could be used to connect the output stage of an LNA $206_1$, $206_2$, $206_3$ or $206_4$ to the output port 208 of the integrated-circuit amplifier 202, if different output stages are beneficial. The MEMS or other switching or selector devices 210, 212 are operated based on a control signal CTRL. It is also conceivable that different control signals are used to trigger the operation of the switching devices 210, 212 at the input and output ports 204, 208, respectively.

As in the embodiment discussed above, the four different LNAs $206_1$, $206_2$, $206_3$ and $206_4$, have four different optimal input impedances, for example 20 Ohm, 54 Ohm, 9 Ohm and 22 Ohm, respectively. The operational frequency of the first two LNAs $206_1$, $206_2$ is 128 MHz, while that of the last two LNAs $206_3$, $206_4$ is 64 MHz. As in the above-mentioned embodiment, it is possible to have fewer or more than four LNAs on the same chip, operating at the above or other operational frequencies. It is also possible to have LNAs with other optimal input impedances as well.

Figure 3:
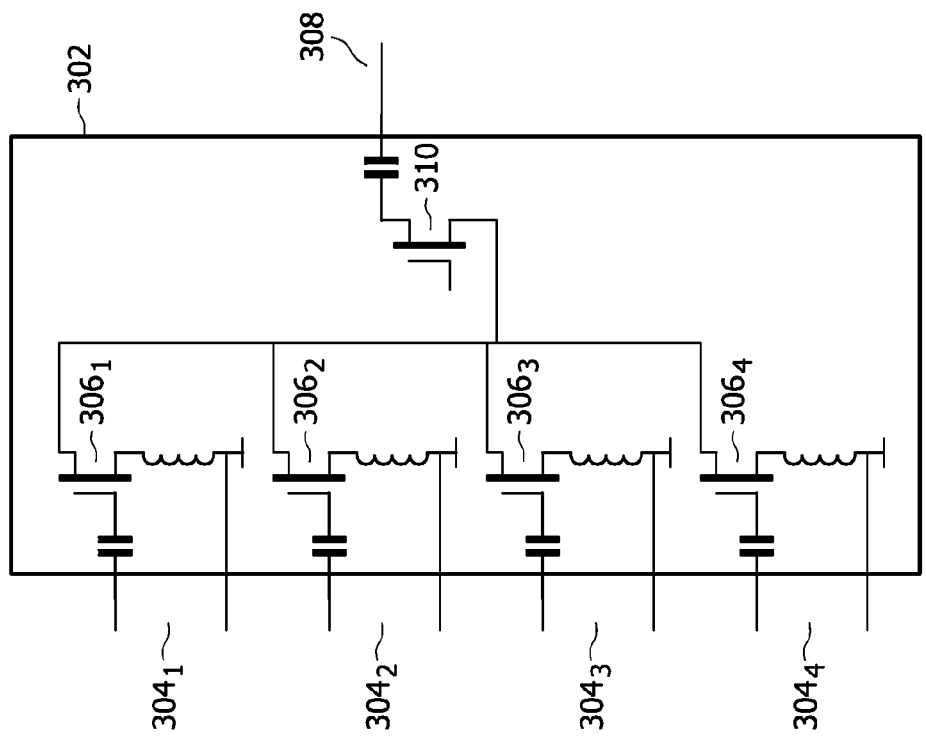
FIG. 3 shows a third embodiment having multiple input ports and a single output port.

FIG. 3 shows a single chip integrated-circuit amplifier 302 with a single output port 308 and multiple input ports $304_1$, $304_2$, $304_3$, $304_4$. Each input port connects to a different first stage amplifier $306_1$, $306_2$, $306_3$, $306_4$ such that each input (or combination of inputs) has a different optimal impedance. The various first stage amplifiers $306_1$, $306_2$, $306_3$, $306_4$ connect to a second stage amplifier 310. Though only one second stage amplifier 310 is shown in this embodiment, it is possible to have multiple second stage amplifiers as well.

Both the first and second-stage amplifiers shown in this embodiment utilize field-effect transistors (FETs), though other implementations are also possible, such as one utilizing bipolar-junction transistors (BJTs). The advantage of using multiple input stages with different optimal impedances is that RF coils having different loop sizes can be connected directly to the same integrated-circuit amplifier 302, by connecting the coil to the appropriate external pins. The inputs of the unused FETs are grounded externally and do not play a role in the circuit anymore. This implementation using FETs has the additional advantage that it requires less space and has fewer external pins than some of the other embodiments. It may be noted that the unused FETs may be left unbiased in order to attain improved power dissipation in the circuit.

Figure 4:
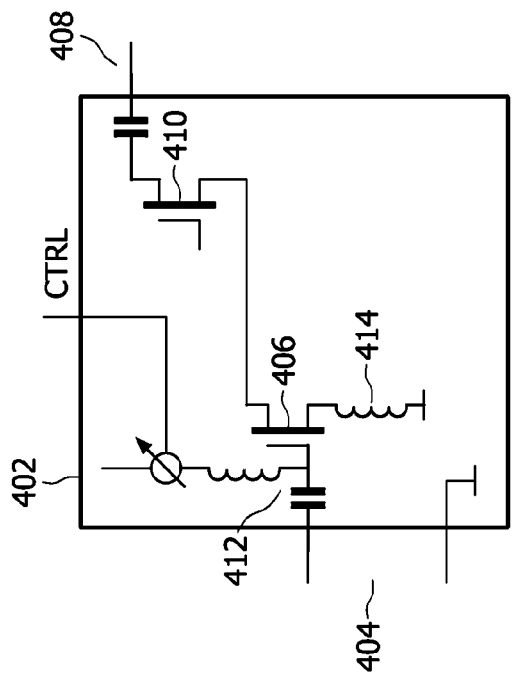
FIG. 4 shows a fourth embodiment wherein the LNA is formed from a field-effect transistor device, and wherein an additional bias voltage is applied.

FIG. 4 shows a single integrated-circuit amplifier chip 402, with a single input port 404 and a single output port 408. A first-stage FET amplifier 406 has its source grounded internally via a degenerating inductor 414, while its drain is connected to the source of a second-stage amplifier 410. This "grounded-gate" configuration results in a low input impedance of the second-stage amplifier. Another way of achieving low input impedance is to use grounded-base bi-polar transistor amplifiers. The second-stage amplifier 410 converts an input current into an amplified output voltage at the output port 408. A control signal CTRL supplied to the gate of the first stage FET amplifier 406 determines the input impedance of the integrated-circuit amplifier 402. The input impedance may be controlled via adjustments in biasing (external controls) or with active and externally controlled feedback. In this embodiment the bias voltage supplied to the gate of the first-stage FET amplifier 406 is made adjustable via an external control signal CTRL, which results in the ability to control the input impedance of the LNA circuit over a limited range. This in turn, makes it possible to connect RF coils of various loop sizes (within a limited range) to the LNA. By incorporating multiple such LNAs in a single chip, the range of RF coils (i.e., loop sizes) that may be connected to the integrated-circuit amplifier may be increased.

Figure 5:
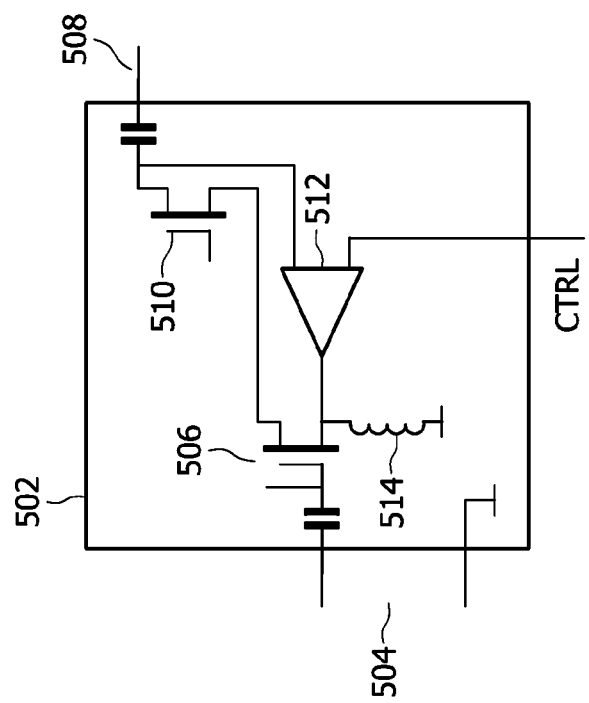
FIG. 5 shows a fifth embodiment in which a feedback loop is added to the LNA.

FIG. 5 shows an integrated-circuit amplifier 502 having a single input port 504 and a single output port 508. The source of the first-stage FET amplifier 506 is grounded internally via a degenerating inductor 514, while its drain is connected to the source of a second-stage FET amplifier 510. A feedback signal is added to the first-stage FET amplifier 506 by connecting it source to the drain of the second-stage FET amplifier 508 via a feedback amplifier 512. The feedback response curve may be controlled externally via the control signal CTRL, and may be used to control the optimal frequency.

Figure 6:
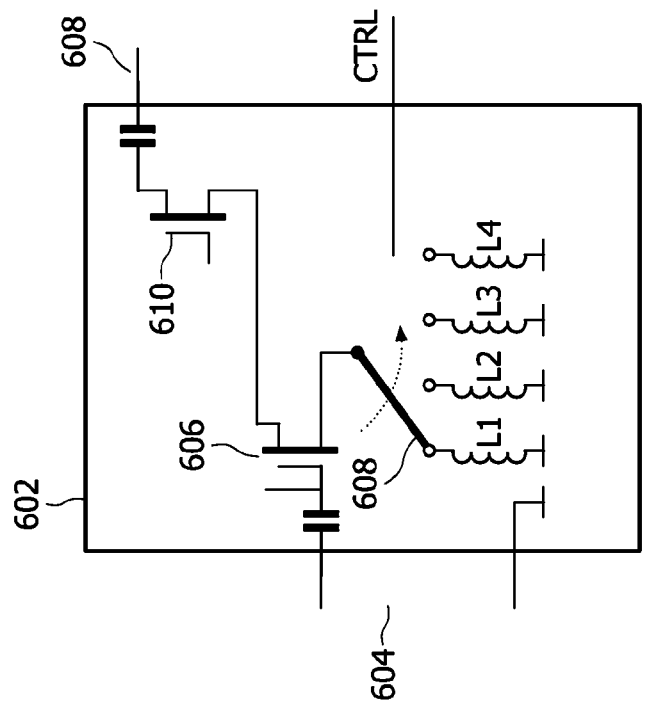
FIG. 6 shows a sixth embodiment wherein a particular degenerating inductor is selected by a switch.

FIG. 6 shows an integrated-circuit amplifier 602 with a single input 604 and a single output 608. The drain of a first-stage FET amplifier 606 is connected to the source of a second-stage FET amplifier 610, while the source of the first-stage FET amplifier 606 is connected to one of a number of degenerating inductors L1, L2, L3, L4, via a switching mechanism 608. This embodiment differs from the embodiment of FIG. 4 in that the inductor connected to the source of the first-stage FET is selectable. The switching mechanism may be a low-noise switch like a MEMS. The switching mechanism is controlled by a control signal CTRL which may be supplied externally.

Some of the advantages of integrating an LNA on a chip include less power consumption, which may be important especially for wireless coils, and less requirements for board-space, which may be especially important for the RF coils used in massive parallel imaging schemes. Several chip technologies exist that might be used for integrating the LNA as disclosed herein, like metal-oxide semiconductor (MOS) using either N-channel or P-channel) FETs, complementary metal-oxide semiconductor (CMOS) using either N-channel or P-channel FETs, bipolar junction transistors (BJT) using bipolar devices, etc.

Though the embodiments of FIGS. 3, 4, 5 and 6 have been depicted as utilizing FETs, it is possible to replace the FETs with BJTs to arrive at alternate configurations having the same functionality. In such cases, the configurations utilizing BJTs may be directly derived from the FET configurations by replacing the words "drain, gate and source" for the FET with the words "collector, base and emitter", respectively for the BJT.

Figure 7:
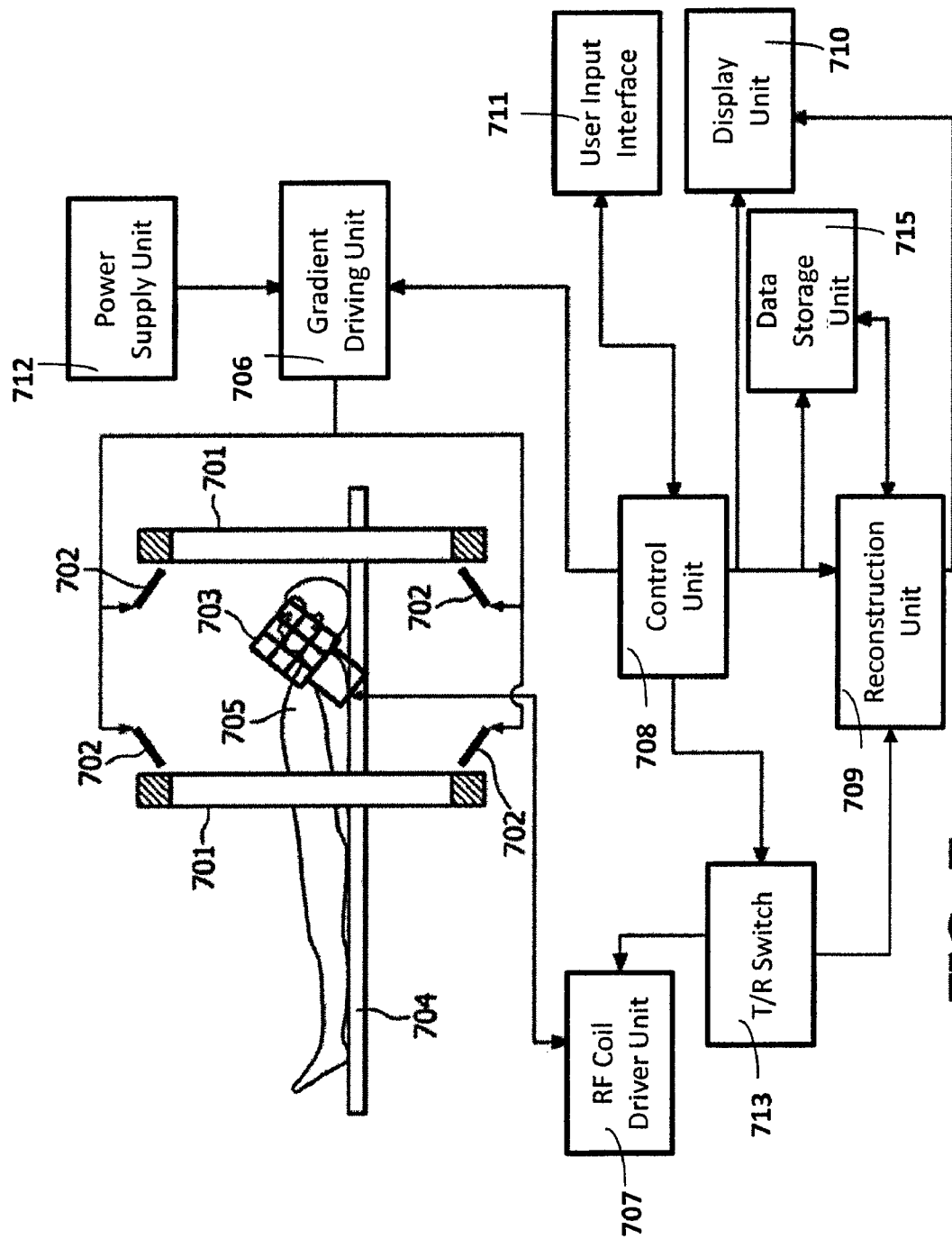
FIG. 7 shows a magnetic resonance system utilizing an integrated-circuit amplifier as disclosed herein.

FIG. 7 shows a possible embodiment of an MR system capable of utilizing the integrated-circuit amplifier as disclosed herein. The MR system comprises a set of main coils 701, multiple gradient coils 702 connected to a gradient driver unit 706, and RF coils 703 connected to an RF coil driver unit 707. The function of the RF coils 703, which may be integrated into the magnet in the form of a body coil, or may be separate surface coils, is further controlled by a transmit/receive (T/R) switch 713. The multiple gradient coils 702 and the RF coils are powered by a power supply unit 712. A transport system 704, for example a patient table, is used to position a subject 705, for example a patient, within the MR imaging system. A control unit 708 controls the RF coils 703 and the gradient coils 702. The control unit 708, though shown as a single unit, may be implemented as multiple units as well. The control unit 708 further controls the operation of a reconstruction unit 709. The control unit 708 also controls a display unit 710, for example a monitor screen or a projector, a data storage unit 715, and a user input interface unit 711, for example, a keyboard, a mouse, a trackball, etc.

The main coils 701 generate a steady and uniform static magnetic field, for example, of field strength 1T, 1.5T or 3T; the embodiments disclosed herein may be used at other field strengths as well. The main coils 701 are arranged in such a way that they typically enclose a tunnel-shaped examination space, into which the subject 705 may be introduced. Another common configuration comprises opposing pole faces with an air gap in between them into which the subject 705 may be introduced by using the transport system 704. To enable MR imaging, temporally variable magnetic field gradients superimposed on the static magnetic field are generated by the multiple gradient coils 702 in response to currents supplied by the gradient driver unit 706. The power supply unit 712, fitted with electronic gradient amplification circuits, supplies currents to the multiple gradient coils 702, as a result of which gradient pulses (also called gradient pulse waveforms) are generated. The control unit 708 controls the characteristics of the currents, notably their strengths, durations and directions, flowing through the gradient coils to create the appropriate gradient waveforms. The RF coils 703 generate RF excitation pulses in the subject 705 and receive MR signals generated by the subject 705 in response to the RF excitation pulses. The RF coil driver unit 707 supplies current to the RF coil 703 to transmit the RF excitation pulse, and amplifies the MR signals received by the RF coil 703. The transmitting and receiving functions of the RF coil 703 or set of RF coils are controlled by the control unit 708 via the T/R switch 713. The T/R switch 713 is provided with electronic circuitry that switches the RF coil 703 between transmit and receive modes, and protects the RF coil 703 and other associated electronic circuitry against breakthrough or other overloads, etc. The characteristics of the transmitted RF excitation pulses, notably their strength and duration, are controlled by the control unit 708.

It is to be noted that though the transmitting and receiving coil are shown as one unit in this embodiment, it is also possible to have separate coils for transmission and reception, respectively. It is further possible to have multiple RF coils 703 for transmitting or receiving or both. The RF coils 703 may be integrated into the magnet in the form of a body coil, or may be separate surface coils. They may have different geometries, for example, a birdcage configuration or a simple loop configuration, etc. The control unit 708 is preferably in the form of a computer that includes a processor, for example a microprocessor. The control unit 708 controls, via the T/R switch 713, the application of RF pulse excitations and the reception of MR signals comprising echoes, free induction decays, etc. User input interface devices 711 like a keyboard, mouse, touch-sensitive screen, trackball, etc., enable an operator to interact with the MR system.

The MR signal received with the RF coils 703 contains the actual information concerning the local spin densities in a region of interest of the subject 705 being imaged. The received signals are reconstructed by the reconstruction unit 709, and displayed on the display unit 710 as an MR image or an MR spectrum. It is alternatively possible to store the signal from the reconstruction unit 709 in a storage unit 715, while awaiting further processing. The reconstruction unit 709 is constructed advantageously as a digital image-processing unit that is programmed to derive the MR signals received from the RF coils 703.

The various embodiments of the integrated-circuit amplifier disclosed herein are suitable for phased-array RF coils that employ multiple receive loops or elements. They are also suitable for other types of coils including one- or two-element coils, though in this case, the requirements regarding isolation of loops from one another are less strict.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed embodiments can be implemented by means of hardware comprising several distinct elements, or by means of a combination of hardware and software. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:
1. A magnetic resonance system comprising:
   a radio-frequency coil; and
   an integrated-circuit amplifier including:
      a plurality of radio-frequency coils, each of the plurality of radio-frequency coils operating at a different impedance that requires different amplification;
      a plurality of input ports, each of the plurality of inputs ports configured to receive the magnetic resonance signal from a corresponding radio-frequency coil;
      one or more low-noise amplifiers configured to amplify the received magnetic resonance signal, wherein each of the one or more low-noise amplifiers correspond to one of the plurality of input ports and one of the plurality of radio-frequency coils; and
      an output port configured to output the amplified magnetic resonance signal from the one or more low-noise amplifiers.
2. An integrated-circuit amplifier configured for amplifying a magnetic resonance signal received from a radio-frequency coil, the integrated-circuit amplifier comprising:
   an input port configured to receive the magnetic resonance signal from the radio-frequency coil;
   one or more low-noise amplifiers configured to amplify the magnetic resonance signal received from the input port;
   a control port and a switch capable of connecting selectively to the one or more low-noise amplifiers, wherein a particular low-noise amplifier is selectable by activating the switch in response to a control signal supplied via the control port; and an output port configured to output the amplified magnetic resonance signal from the one or more low-noise amplifiers.

3. The integrated-circuit amplifier of claim 2, including multiple input and output ports and a switching device configured to connect each of the one or more low-noise amplifiers to the output port,
wherein each low-noise amplifier is connected to a respective input port and output port, and wherein a particular low-noise amplifier is selectable by connecting to the respective input and output ports.

4. The integrated-circuit amplifier of claim 2, including multiple input ports and a single output port, wherein each low-noise amplifier is connected to a respective input port and to the single output port, and wherein a particular low-noise amplifier is selectable by connecting the radio-frequency coil to the respective input port.

5. The integrated-circuit amplifier of claim 2, wherein the low-noise amplifier is a field effect transistor device including:
a drain connected to the output port;
a gate connected to the input port; and
a source;
wherein at least one of an additional adjustable bias voltage is applied to the gate in order to control a gain of the low-noise amplifier within a limited range and the low-noise amplifier includes a feedback circuit connected from the drain to the source.

6. The integrated-circuit amplifier of claim 2, including a control port and two or more degenerating inductors selectable by a switch, wherein the low-noise amplifier is a bipolar junction transistor device including:
a collector connected to the output port;
a base connected to the input port; and an emitter; and
wherein the switch is configured to connect the emitter to a particular degenerating inductor based on a control signal applied to the control port.

7. The integrated-circuit amplifier of claim 2, including a control port and two or more degenerating inductors selectable by a switch, wherein the low-noise amplifier is a field effect transistor device including:
a drain connected to the output port;
a gate connected to-the input port; and a source; and
wherein the switch is configured to connect the source to a particular degenerating inductor based on a control signal applied to the control part.

8. The integrated-circuit amplifier of claim 2, wherein the low-noise amplifier is a bipolar junction transistor device including:
a collector connected to the output port;
a base connected to the input port; and
an emitter
wherein at least one of an additional adjustable bias voltage is applied to the base in order to control a gain of the low-noise amplifier within a limited range and the low-noise amplifier includes a feedback circuit connected from the collector to the emitter.

9. The integrated-circuit amplifier of claim 2, wherein the one or more low-noise amplifiers are first stage amplifiers and further including:
a second stage amplifier connected to the one or more low-noise amplifiers.

10. An integrated-circuit amplifier configured for amplifying a magnetic resonance signal received from a radio-frequency coil, the integrated-circuit amplifier comprising:
an input port configured to receive the magnetic resonance signal from the radio-frequency coil;
one or more low-noise amplifiers configured to amplify the magnetic resonance signal received from the input port;
a switching device configured to connect each of the one or more low-noise amplifiers to an output port; and
an output port configured to output the amplified magnetic resonance signal from the one or more low-noise amplifiers.

11. The integrated-circuit amplifier of claim 10, wherein each of low-noise amplifiers have different optimal input impedances.

12. The integrated-circuit amplifier of claim 10, wherein the switching device includes a micro-electromechanical switch (MEMS).

13. The integrated-circuit amplifier of claim 12, wherein the MEMS is operated by a control signal.

14. The integrated-circuit amplifier of claim 10, wherein the one or more low-noise amplifiers are first stage amplifiers and further including:
a second stage amplifier connected to the one or more low-noise amplifiers.

15. The integrated-circuit amplifier of claim 14, wherein a drain of the one or more first stage amplifiers are connected to a source of the second stage amplifier.

16. The integrated-circuit amplifier of claim 14, wherein a bias voltage supplied to a gate of the one or more first stage amplifiers are adjustable via a control signal.

17. The integrated-circuit amplifier of claim 10, wherein each of the one or more first stage amplifiers are connected to a degenerating inductor via the switching device.

18. The integrated-circuit amplifier of claim 17, wherein each of the degenerating inductors are connected to a source of a corresponding first state amplifier.

* * * * *